United States Patent [19]
Zambrano

[11] Patent Number: 5,777,367
[45] Date of Patent: Jul. 7, 1998

[54] INTEGRATED STRUCTURE ACTIVE CLAMP FOR THE PROTECTION OF POWER DEVICES AGAINST OVERVOLTAGES

[75] Inventor: Raffaele Zambrano, San Giovanni La Punta, Italy

[73] Assignee: Consorzio per la Ricerca sulla Microelettronica nel Mezzogiorno, Catania, Italy

[21] Appl. No.: 927,304

[22] Filed: Sep. 11, 1997

Related U.S. Application Data

[63] Continuation of Ser. No. 306,647, Sep. 15, 1994, abandoned.

[30] Foreign Application Priority Data

Sep. 30, 1993 [EP] European Pat. Off. ............ 93830397

[51] Int. Cl.$^6$ .................................................. H01L 23/62
[52] U.S. Cl. .................................... 257/355; 257/356
[58] Field of Search ................................. 257/355, 360, 257/545, 546, 547, 356, 358

[56] References Cited

U.S. PATENT DOCUMENTS

| | | | |
|---|---|---|---|
| 3,806,773 | 4/1974 | Watanabe | 317/235 R |
| 4,893,158 | 1/1990 | Mihara et al. | 357/23.13 |
| 4,922,371 | 5/1990 | Gray et al. | 361/91 |
| 4,947,231 | 8/1990 | Palara et al. | 357/48 |
| 5,162,966 | 11/1992 | Fujihara | 257/140 |
| 5,338,964 | 8/1994 | Bernier | 257/476 |
| 5,401,996 | 3/1995 | Kelly | 257/360 |
| 5,652,455 | 7/1997 | Zambrano | 257/360 |

FOREIGN PATENT DOCUMENTS

| | | | |
|---|---|---|---|
| A-0 315 213 | 5/1989 | European Pat. Off. | H01L 27/02 |
| A-0315213 | 5/1989 | European Pat. Off. | H01L 27/02 |
| A-0 327 475 | 8/1989 | European Pat. Off. | H01L 27/02 |
| A-0 345 432 | 12/1989 | European Pat. Off. | H01L 27/02 |
| A-0345432 | 12/1989 | European Pat. Off. | H01L 27/02 |
| 0372820 | 6/1990 | European Pat. Off. | 257/356 |
| A-0 372 820 | 6/1990 | European Pat. Off. | H01L 27/06 |
| A-0 437 939 | 7/1991 | European Pat. Off. | H01L 29/78 |
| A-0437939 | 7/1991 | European Pat. Off. | H01L 29/78 |
| A-2146323 | 7/1972 | France | H01L 11/00 |
| A-2 260 869 | 8/1975 | France | H01L 27/04 |
| A-3 142 591 | 10/1982 | Germany | H02H 7/127 |
| 52-3389 | 1/1977 | Japan | 257/356 |
| A-52 3389 | 11/1977 | Japan | H01L 29/78 |
| 59-44872 | 3/1984 | Japan | 257/356 |
| A-59 44872 | 3/1984 | Japan | H01L 29/78 |
| 57-232396 | 7/1984 | Japan | 257/356 |
| A-59 117165 | 7/1984 | Japan | H01L 29/78 |

*Primary Examiner*—Mahshid D. Saadat
*Assistant Examiner*—Nathan K. Kelley
*Attorney, Agent, or Firm*—Wolf, Greenfield & Sacks

[57] ABSTRACT

An integrated structure active clamp for the protection of a power device against overvoltages includes a plurality of serially connected diodes, each having a first and a second electrode, obtained in a lightly doped epitaxial layer of a first conductivity type in which the power device is also obtained; a first diode of said plurality of diodes has the first electrode connected to a gate layer of the power device and the second electrode connected to the second electrode of at least one second diode of the plurality whose first electrode is connected to a drain region of the power device; said first diode has its first electrode comprising a heavily doped contact region of the first conductivity type included in a lightly doped epitaxial layer region of the first conductivity type which is isolated from said lightly doped epitaxial layer by a buried region of a second conductivity type and by a heavily doped annular region of the second conductivity type extending from a semiconductor top surface to said buried region.

22 Claims, 6 Drawing Sheets

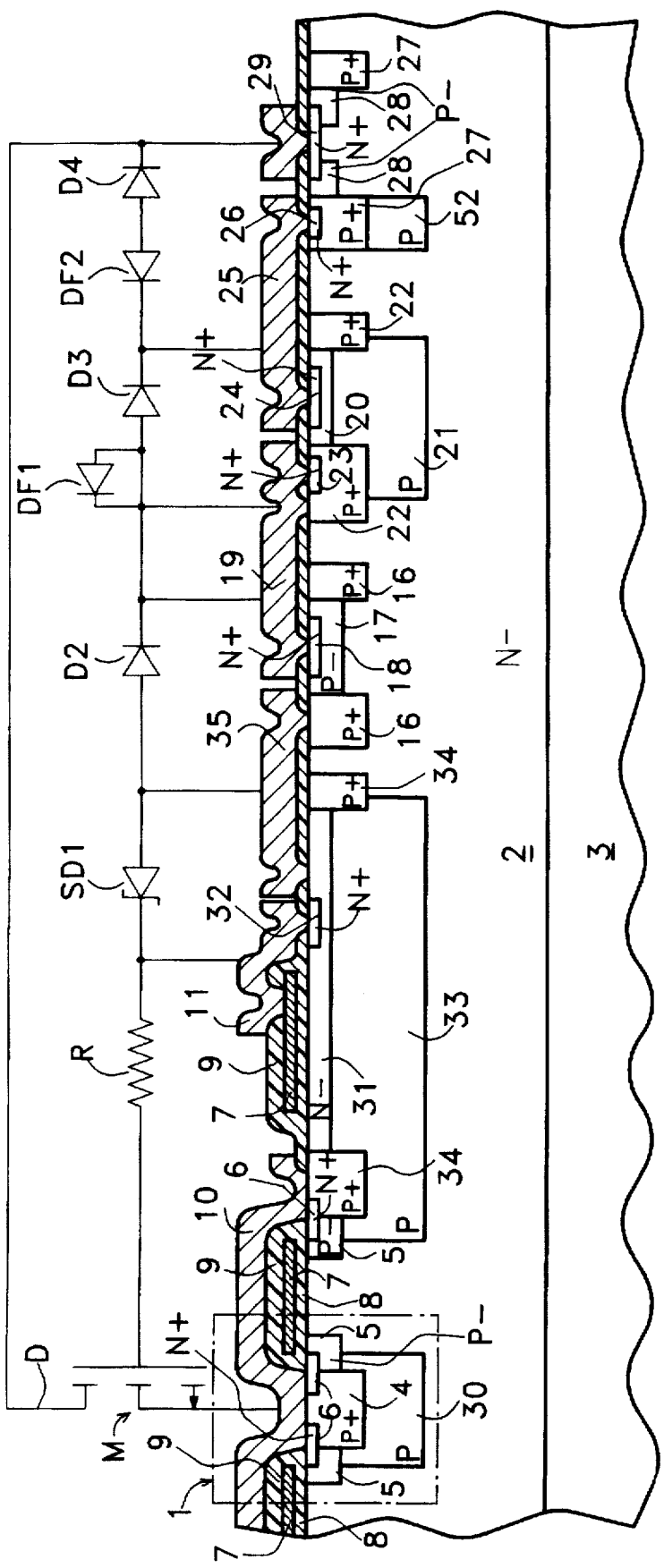

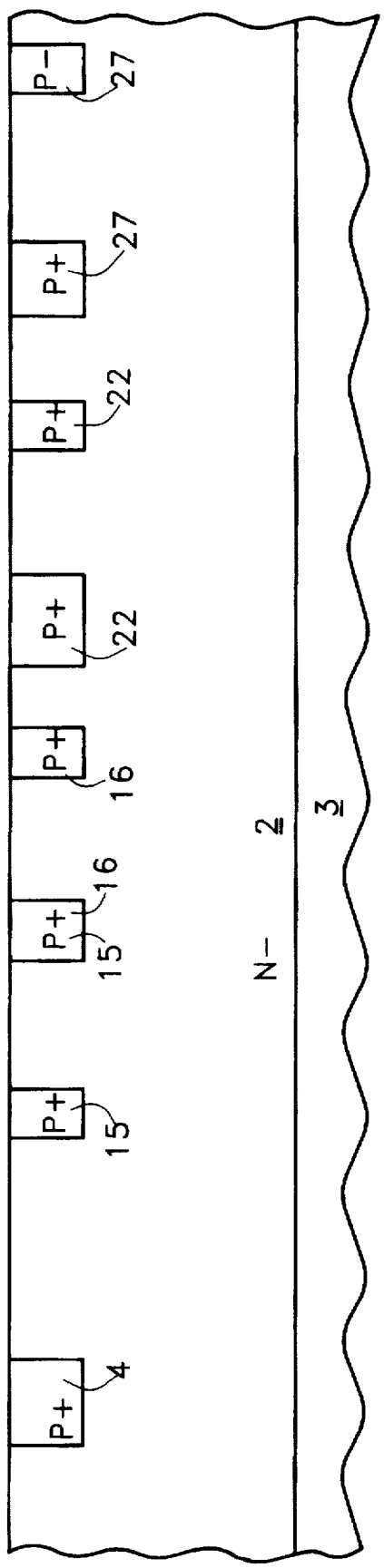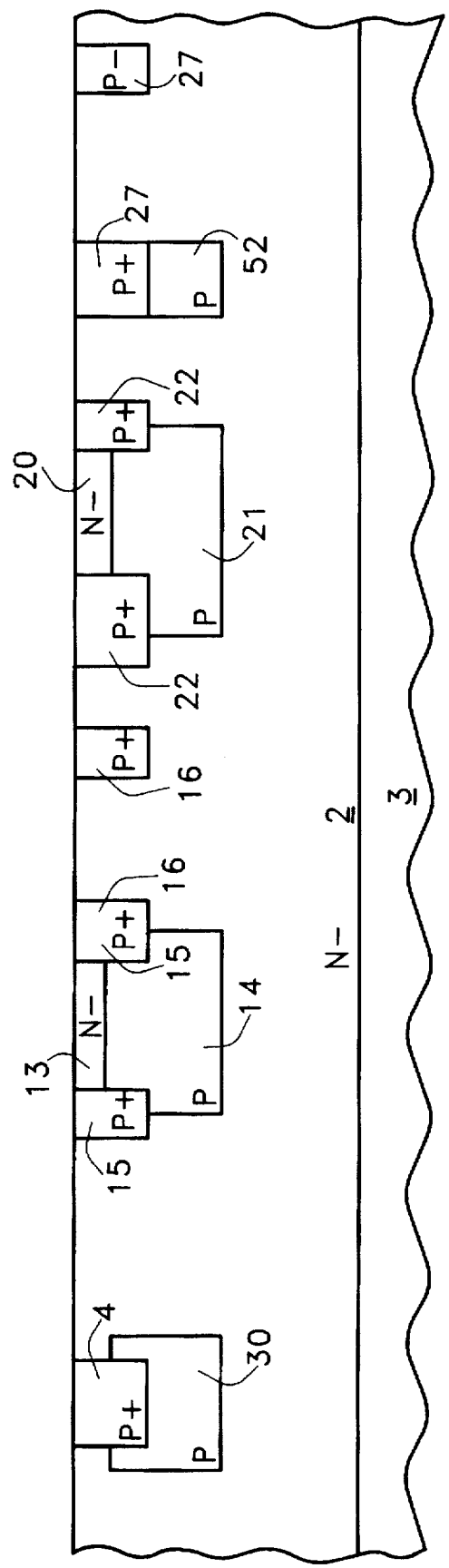

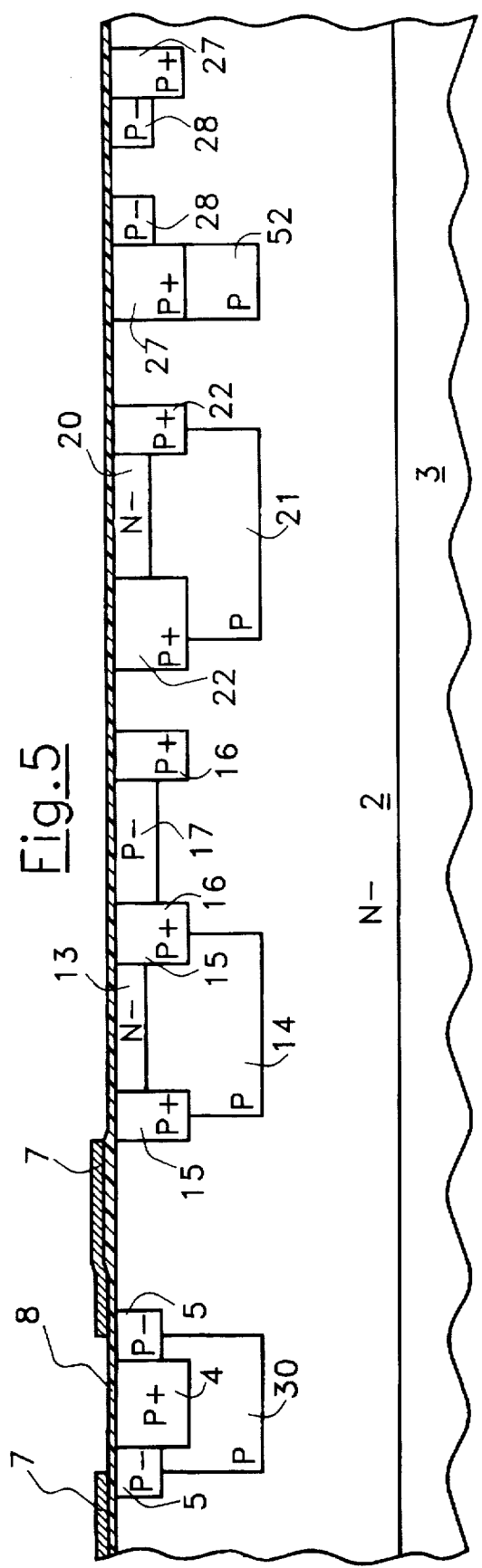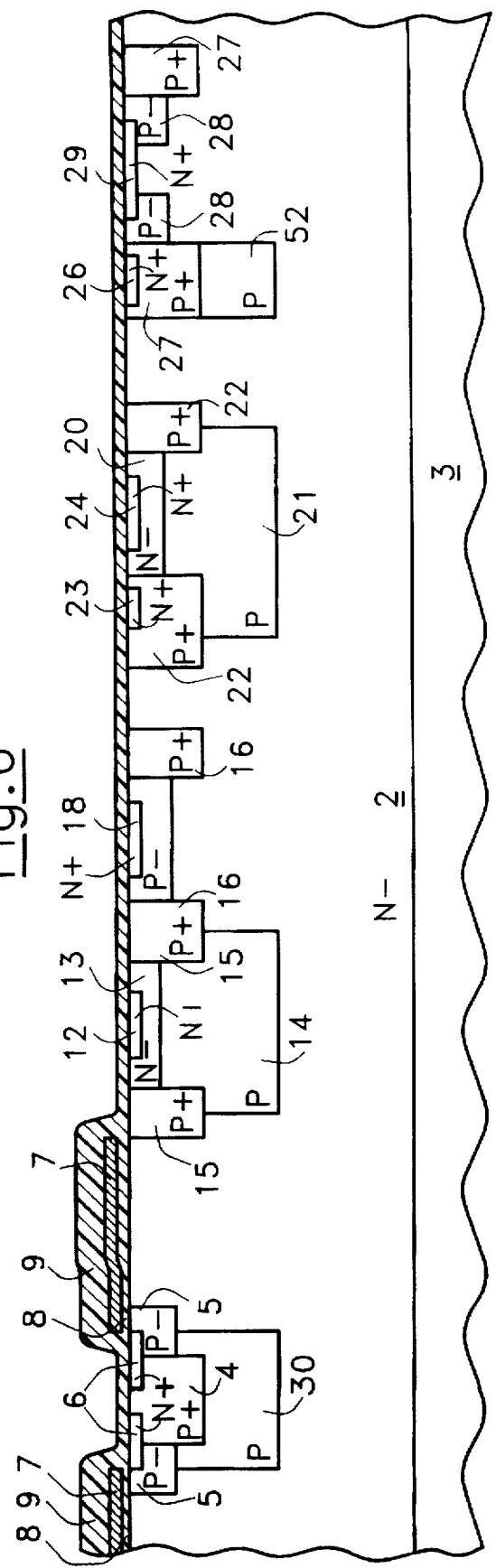

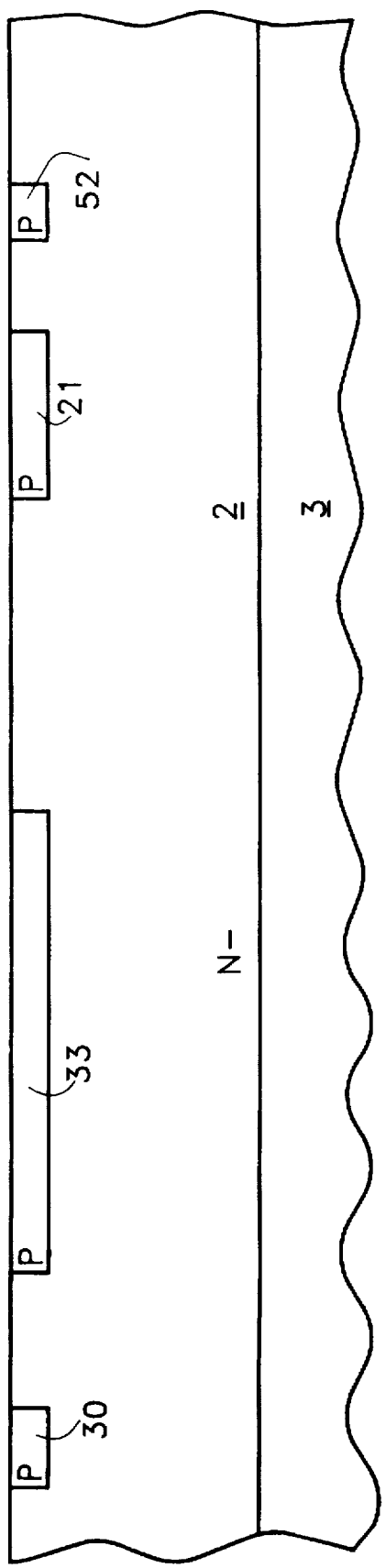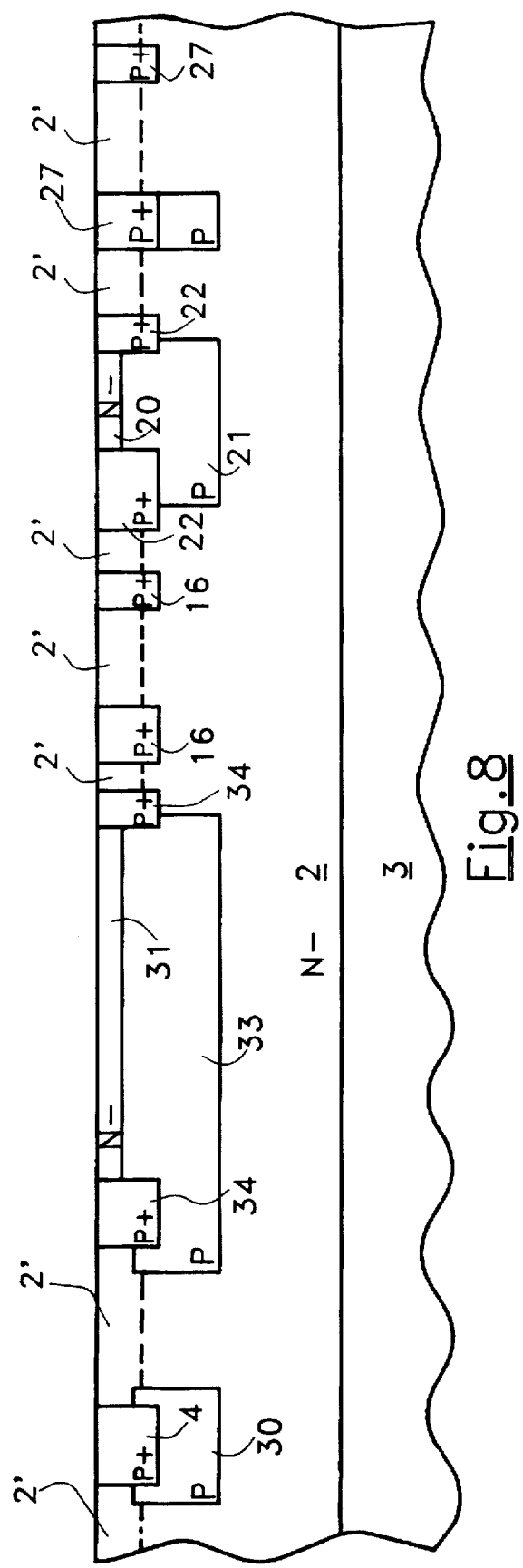

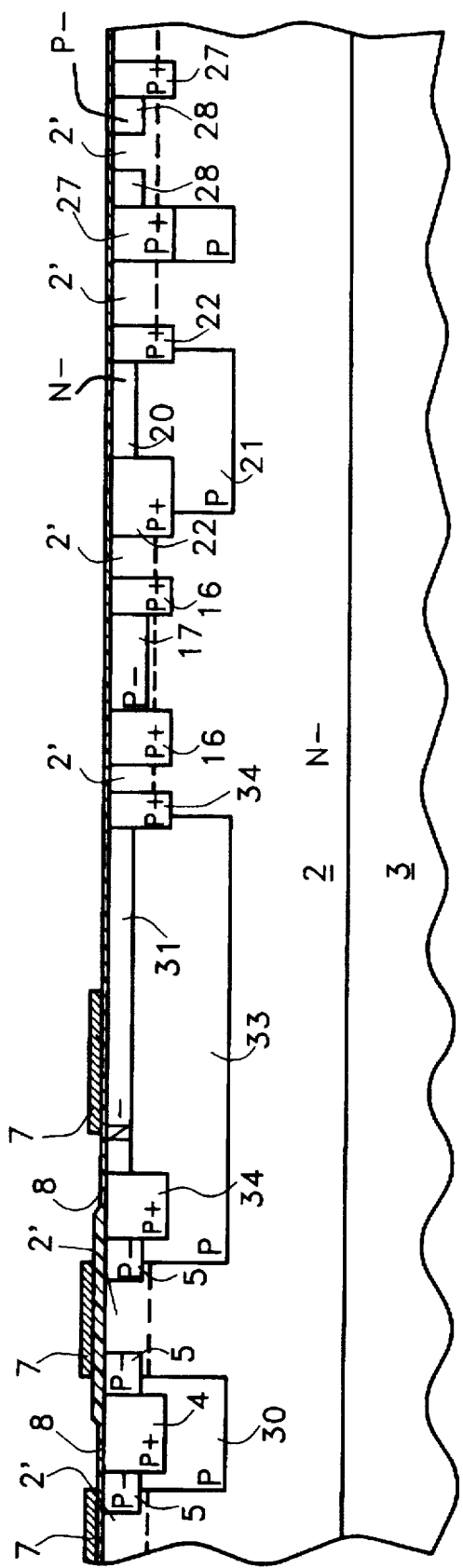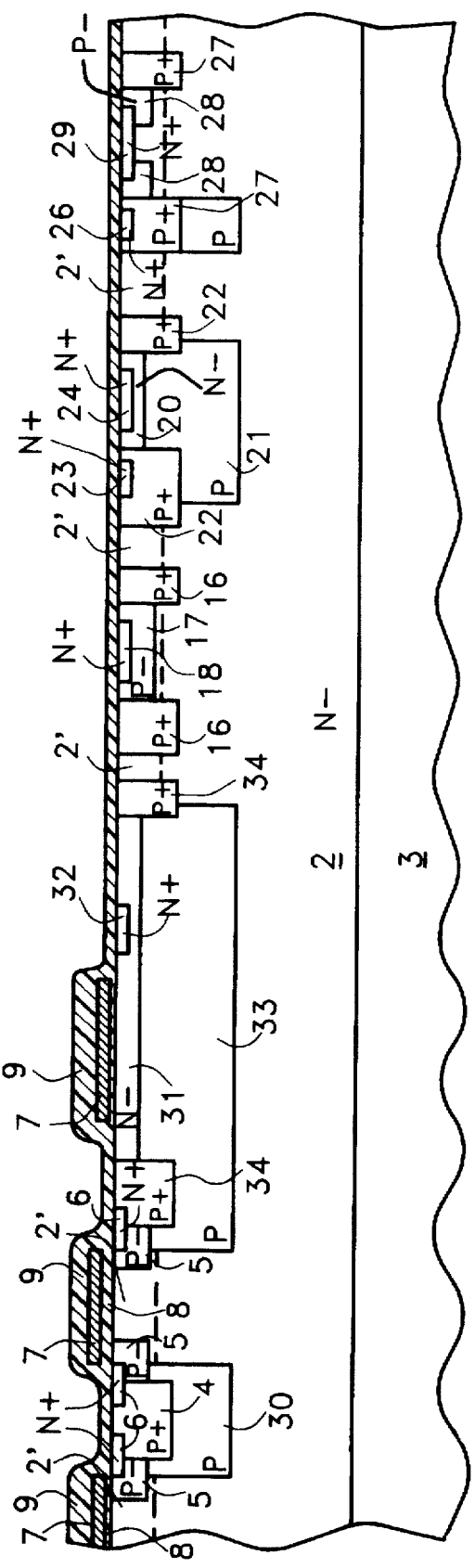

5,777,367

1

INTEGRATED STRUCTURE ACTIVE CLAMP FOR THE PROTECTION OF POWER DEVICES AGAINST OVERVOLTAGES

This application is a continuation of application Ser. No. 08/306,647, filed Sept. 15, 1994, now abandoned.

BACKGROUND OF THE INVENTION

1. Field of the Invention

The present invention relates to an integrated structure active clamp for the protection of power devices, particularly, high-voltage MOSFETs and IGBTs, against overvoltages, and to a manufacturing process thereof.

2. Discussion of Related Art

The term "active clamp" refers to a circuit that is integrated on the same chip with a semiconductor power device to protect it from overvoltages.

The problems concerning the integration of active clamps in power devices have been discussed in the European Patent Application No. 93830200.7 filed on May 13, 1993 in the name of the same Applicant. In this document, an integrated structure protection circuit comprising a plurality of serially connected junction diodes between the gate and the drain of the power device is disclosed.

Parasitic components associated with this structure could generate incorrect functioning. For example, the first diode of the chain, connected to the gate of the power device, has a parasitic bipolar transistor associated with it; this bipolar transistor has a collector-emitter breakdown voltage ($BV_{CES}$) equal to the drain-source breakdown voltage ($BV_{DSS}$) of the power device. However, when the protection circuit operates the parasitic transistor is biased in the active region, the base current being equal to the current flowing through the protection circuit. This causes the collector-emitter voltage across the parasitic transistor, and thus the clamping voltage (Vclamp) of the protection circuit, to drop to a value ($LV_{CEO}$) which is much lower than the BVCES, while the desired Vclamp should be just a little bit lower than the $BV_{DSS}$.

Consequently, if the power device is a power MOSFET, it is necessary to increase the thickness of the epitaxial layer, i.e., its $BV_{DSS}$, with the consequence of an undesired increase in the "on" resistance value ($R^{DS(on)}$).

In the case of an Insulated Gate Bipolar Transistor (IGBT), due to the presence of a P+ substrate, the parasitic component is no longer a bipolar transistor, but an SCR, which can trigger a degenerative condition that could lead to the device destruction.

Different techniques for the integration of active clamps are known.

One of the known technique provides for the integration of a series of polysilicon diodes connected in parallel between the gate and the drain of the power device.

According to another technique, disclosed in JP-055202, dated Mar. 20, 1991, the active clamp features a polysilicon diode in series to a junction diode.

In U.S. Pat. No. 5,162,966 there is disclosed an N-channel MOSFET with gate shortcircuited to the drain and channel region connected to the source of the power MOSFET in series to a series of junction diodes.

In view of the state of the art just described, an object of the present invention is to accomplish an integrated structure active clamp in which the effects of parasitic components are minimized.

2

SUMMARY OF THE INVENTION

According to the present invention, such object is attained by means of an integrated structure active clamp for a power device comprising a plurality of serially connected diodes, each having a first and a second electrodes, defined in a lightly doped epitaxial layer of a first conductivity type in which the power device is also obtained. A first diode of the plurality of diodes has the first electrode connected to a gate layer of the power device, and the second electrode is connected to a second electrode of at least one second diode of the plurality whose first electrode is coupled to a drain region of the power device. That is, the first electrode of the second diode may be directly connected to the drain, or it may be electrically coupled via intervening diodes. The first electrode of the first diode includes a heavily doped contact region of the first conductivity type included in a lightly doped epitaxial layer region of the first conductivity type, which is isolated from the lightly doped epitaxial layer by a buried region of a second conductivity type and by a heavily doped annular region of the second conductivity type extending from a semiconductor top surface to said buried region.

According to an embodiment of the present invention, the first diode is a junction diode, and its second electrode is represented by the buried region and by the annular region of the second conductivity type.

According to another embodiment of the present invention, the first diode is a Schottky diode, and its second electrode includes a metallization strip in contact with said lightly doped epitaxial layer region, the metallization strip being also connected to the second electrode of the at least one second diode.

According to the present invention, the injection of carriers from the first electrode of the first diode into its second electrode is minimized, and the gain of the parasitic transistor having emitter, base, and collector represented by the first electrode and the second electrode of the diode and the lightly doped epitaxial layer is minimized.

BRIEF DESCRIPTION OF THE DRAWINGS

The features of the present invention shall be made more evident by the following detailed description of two embodiments, illustrated as non-limiting examples in the annexed drawings, wherein.

FIG. 2 is a cross sectional view of said power device with an integrated structure active clamp according to another embodiment of the invention;

FIGS. 3 to 6 are cross-sectional views of intermediate steps of a manufacturing process of the active clamp according to the invention, for the fabrication of the device of FIG. 1;

FIGS. 7 to 10 are cross-sectional views of another manufacturing process of the active clamp according to the invention, for the fabrication of the device of FIG. 2.

DETAILED DESCRIPTION

Figure 1:
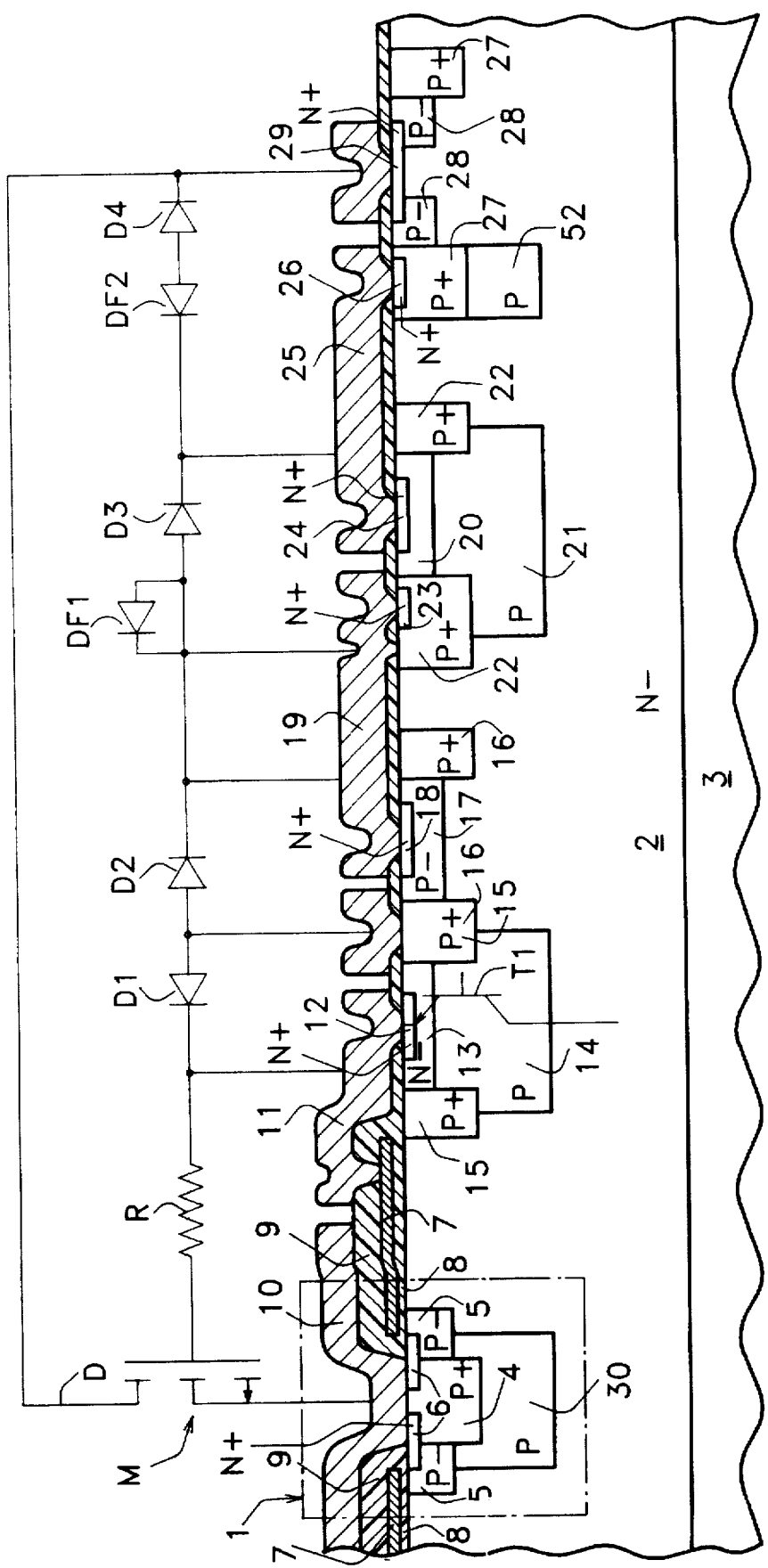
FIG. 1 is a cross-sectional view of a power device with an integrated structure active clamp according to one embodiment of the invention.

With reference to FIG. 1, an integrated power device M, for example a N-channel power MOSFET or an IGBT, includes a bidimensional array of elementary cells 1 (only one of which is shown in FIG. 1) obtained in a lightly doped epitaxial layer 2 of the N conductivity type, grown over a heavily doped semiconductor substrate 3 having a low resistivity value. In the case of a power MOSFET the substrate 3 is of the N type, whereas in the case of an IGBT it is of the P type.

Each cell 1 includes a heavily doped P type deep body region 4, surrounded by a lightly doped P type body region 5; a heavily doped N type region 6 partially overlaps both the deep body region 4 and the body region 5, and provides a source region of the elementary cell 1. A polysilicon gate layer 7, isolated from the semiconductor top surface by a thin gate oxide layer 8 forms a conductive channel in a surface portion of the body region 5, when a proper bias voltage is applied to it which represents a channel region of the cell 1. The polysilicon gate layer 7 is covered by an insulating oxide layer 9, a contact area is provided to allow a superimposed metal strip 10 to contact the source region 6 and the deep body region 4, thus providing a source contact to the cell 1. The metal strip 10 similarly contacts all the other cells 1 of the bidimensional array (not shown).

The gate layer 7 is contacted by another metal strip 11 to provide a gate contact for the cells 1. This same metal strip 11 also contacts a heavily doped N type region 12, which represents a contact region to a cathode region 13 of a first diode D1 belonging to a plurality of serially connected diodes D1–D4 and DF1, DF2; this plurality of diodes as a whole provides an integrated structure active clamp suitable to protect the power device M against overvoltages. Even if in the example of FIG. 1 only six diodes are shown, the number of diodes connected in series may be higher, being determined by the desired value of Vclamp.

The cathode region 13 of diode D1 is provided by a portion of the epitaxial layer 2, which is electrically isolated from the bulk epitaxial layer 2 by a P type buried region 14, forming an anode region of diode D1, and by a P+ annular region 15; the region 13 is lightly doped, and this reduces the emitter efficiency of a parasitic bipolar transistor T1 having emitter, base, and collector, respectively, represented by the cathode region 13, the buried layer 14, and the epitaxial layer 2.

The resistor R shown in the figure is deliberately introduced by extending the gate layer 7 before contacting it to the metal strip 11, to increase if needed the series resistance of the active clamp.

The P+ region 15 is merged with another P+ annular region 16, which surrounds a Pregion 17 providing an anode region of a second diode D2 of the plurality. Inside the Pregion 17, an N+ region 18 forms a cathode for diode D2, and is connected by means of a metal strip 19 to a third diode D3 of the plurality of diodes.

The diode D3 is almost identical in its structure to the diode D1, and has a cathode region having a portion 20 of the epitaxial layer, in which an N+ contact region 24 is obtained, and an anode region represented by a buried region 21. The only difference with diode D1 is that the annular P+ region 22 not only allows isolation of the portion 20 from the bulk epitaxial layer 2, but also constitutes an anode for a diode DF1, whose cathode is represented by an N+ region 23. As described in the cited Patent Application, the diode DF1 is one of a number of intermediate diodes (two of such diodes are shown in FIG. 1) forward biased during the active clamp operation. The presence of such forward biased diodes, due to the negative thermal coefficient of their forward voltage, allows to compensate for the positive thermal coefficient of the breakdown voltage of those diodes, such as D2–D5, which operate in reverse bias condition, so that a stable value of Vclamp can be achieved.

Furthermore, since the forward voltage of a diode is generally much lower than its breakdown voltage, the insertion of forward biased diodes makes it possible to vary the value of Vclamp almost continuously, and not only in step corresponding to one breakdown voltage, as it would be if only reverse biased diodes were present. As shown in FIG. 1, the intermediate diodes such as DF1 and DF2 have a structure which allows, simply by modifying the metal interconnections mask, to bypass those intermediate diodes which are not necessary in the specific application (as DF1 in FIG. 1, wherein the metal strip 19 contacts both the anode region 22 and the cathode region 23 of diode DF1).

The contact region 24 of diode D3 is connected by a metal strip 25 to the N+ cathode region 26 of the diode DF2 which, in contrast to DF1, has not been bypassed; the anode of DF2 is a P+ annular region 27, a Pannular region 28 inside it provides the anode of diode D4; an N+ region 29 forms a cathode for diode D4 and is connected to the drain D of the power device M. A P type buried region 52 is also provided under that portion of the P+ annular region 27 inside which the N+ cathode region 26 is obtained, in order to further reduce parasitic effects.

A P type buried region 30 is also defined under the cells 1 to reduce the gain and the base resistance of the parasitic transistor associated with each of them.

FIG. 2, refers to another embodiment of the invention, and shows again the power device M with an active clamp structure provided a plurality of serially connected diodes D1–D4 and DF1, DF2, but the first diode SD1, is a Schottky diode. Its cathode comprises a portion 31 of the lightly doped epitaxial layer 2, similarly to diode D1 of the previous embodiment, and is connected to the polysilicon gate layer 7, through a heavily doped N type region 32 corresponding to the contact region 12 of FIG. 1, by the metal strip 11. The portion 31 is isolated from the epitaxial layer 2 by a P type buried region 33 and by a P+ annular region 34, which also provides a P+ deep body region of an elementary cell in the periphery of the bidimensional array. This cell has a slightly different topology, but is functionally identical to the other cells 1 of the array.

A metal strip 35 contacts the portion 31, and because since this is lightly doped, a rectifying contact is formed which allows the formation of the diode SD1. The anode of SD1 is represented by the metal strip 35, and is connected to the anode of the diode D2. The remaining part of the structure of FIG. 2 is identical to that of FIG. 1. The structure of the diode D3 is again substantially identical to that of the diode D1 in FIG. 1, but diode D3 could be as well identical to diode SD1.

A manufacturing process suitable to obtain both of the described embodiments of the invention will be now described with reference to FIGS. 3 to 6.

The lightly doped epitaxial layer 2 is initially grown over the substrate 3. After the oxidation of the entire semiconductor surface, a masked implant of P type dopant ions is performed into selected areas of the epitaxial layer 2 to obtain, after diffusion, heavily doped P type deep body regions 4, 15, 16, 22 and 27 (FIG. 3).

A selective implant of P type dopant ions into the epitaxial layer 2 allows the formation of medium doped P type buried regions 30, 14, 21 and 52. The energy of the implanted ions must be high enough so that the dopant concentration peak is located below the semiconductor surface and the concentration of acceptor impurities near the surface is lower than the concentration of donor impurities of the epitaxial layer 2, so that portions 13 and 20 of the epitaxial layer, isolated from the bulk epitaxial layer 2, can be obtained (FIG. 4).

Active areas are then defined on the semiconductor surface, and the thin gate oxide layer 8 is grown over them. The polysilicon gate layer 7 is successively deposited over the entire surface of the semiconductor, and is doped to reduce its resistivity.

The polysilicon layer 7 is then selectively removed outside those regions which will become gate regions of the elementary cells 1; a low concentration of P type dopant ions is then implanted and diffused to obtain lightly doped P type body regions 5 at the sides of and under said gate regions to form a channel region of the elementary cells 1; this step also allows the formation of anode regions 17 and 28 of some diodes of the active clamp, in the example D2 and D4 (FIG. 5).

A high concentration of N type dopant ions is then selectively implanted at the sides of said gate regions to form the source regions 6 of the elementary cells 1; this same step also provides for the formation of cathode regions 18, 23, 26 and 29 for diodes D2, DF1, DF2 and D4, and for the formation of cathode contact regions 12 and 24 for the diodes D1 and D3. An insulating oxide layer 9 is then deposited over the semiconductor surface (FIG. 6).

Contact areas are then opened in the insulating oxide layer 9 to allow a superimposed metal layer to electrically interconnect the various components. The metal layer is then selectively etched, to define the metal strips 10, 11, 19 and 25.

The semiconductor surface is then covered by a passivating material, and a metal layer (not shown in the drawings) is deposited on the bottom surface of the substrate 3 to provide an electrical drain contact for the power device.

Another manufacturing process suitable to obtain both the embodiments of the invention is shown in FIGS. 7 to 10, which by way of example relates to the fabrication of the structure of FIG. 2.

After the growth of the lightly doped epitaxial layer 2 over the substrate 3, and the oxidation of the entire semiconductor surface, P type dopant ions are selectively implanted and diffused into the epitaxial layer 2 to form the medium doped P type buried regions 30, 33, 21 and 52 (FIG. 7).

The previously grown oxide layer is then removed from the semiconductor surface, and another lightly doped N type epitaxial layer 2' is grown over the epitaxial layer 2; the two epitaxial layers 2 and 2' can have the same concentration of dopants.

Field oxidation, masked implant and diffusion of a high concentration of P type dopant ions are carried out to form heavily doped P type deep body regions 4, 34, 16, 22 and 27 (FIG. 8).

Active areas are then defined on the surface of the semiconductor, a thin gate oxide layer 8 is grown over said active areas, and a polysilicon layer is deposited over the entire surface of the semiconductor, and is doped to reduce its resistivity.

The polysilicon layer is then selectively etched outside those regions which will become gate regions of the elementary cells 1, and the masked implant and diffusion of a low concentration of P type dopant ions allows the creation of lightly doped P type body regions 5 at the sides of and under said gate regions to form channel regions of the cells 1; this same step allows the formation of anode regions 17 and 28 of some diodes (D2 and D4 in the example) of the active clamp (FIG. 9).

A high concentration of N type dopant ions are then selectively implanted and diffused at the sides of the gate regions to form source regions 6 of the cells 1; this same step also provides for the formation of cathode regions 18, 23, 26 and 29 for diodes D2, DF1, DF2 and D4, and for the formation of cathode contact regions 32 and 24 for the diodes D1 and D3. An insulating oxide layer 9 is then deposited over the semiconductor surface (FIG. 10).

The process continues with the same steps described in connection with the previously described fabrication process.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. An integrated structure active clamp for the protection of a power device against overvoltages, comprising a plurality of serially connected diodes, each having a first and a second electrode, and each defined in a first lightly doped epitaxial layer of a first conductivity type in which the power device is also obtained, a first diode of said plurality of diodes having the first electrode connected to a gate layer of the power device and the second electrode connected to the second electrode of at least one second diode of the plurality, the second diode having its first electrode coupled to a drain region of the power device, wherein the first electrode of said first diode comprises a heavily doped contact region of the first conductivity type included in a second lightly doped epitaxial layer region of the first conductivity type which is isolated from said first lightly doped epitaxial layer by a buried region of a second conductivity type and by a heavily doped annular region of the second conductivity type extending from a semiconductor top surface to said buried region.

2. The active clamp according to claim 1, wherein said first diode is a junction diode, and its second electrode is represented by said buried region and by said annular region of the second conductivity type.

3. The active clamp according to claim 1, wherein said first diode is a Schottky diode, and its second electrode comprises a metallization strip in contact with said second lightly doped epitaxial layer region of the first conductivity type, said metallization strip being also connected to the second electrode of said at least one second diode.

4. The active clamp according to claim 1, wherein said at least one second diode has its first electrode comprising a second heavily doped contact region of the first conductivity type included in a third lightly doped epitaxial layer region of the first conductivity type which is isolated from said first lightly doped epitaxial layer by a second buried region of the second conductivity type and by a second heavily doped annular region of the second conductivity type extending from the semiconductor top surface to the second buried region.

5. The active clamp according to claim 1, wherein said plurality of serially connected diodes comprises a series of plurality of said second diodes interposed between the second electrode of the first diode and the drain region of the power device.

6. The active clamp according to claim 1 wherein said first lightly doped epitaxial layer is superimposed over a heavily doped semiconductor substrate.

7. The active clamp according to claim 6, wherein said semiconductor substrate is of the first conductivity type and the power device is a power MOSFET.

8. The active clamp according to claim 6, wherein said semiconductor substrate is of the second conductivity type and the power device is an IGBT.

9. The active clamp according to claim 1, wherein said first conductivity type regions are doped with donor impurities, and said second conductivity type regions are doped with acceptor impurities.

10. The active clamp according to claim 1, wherein said first conductivity type regions are doped with acceptor impurities, and said second conductivity type regions are doped with donor impurities.

11. An integrated circuit, comprising:
a power device having a gate region and a drain region, the power device formed in a first epitaxial layer; and
a protection circuit formed in the first epitaxial layer including a first diode, the first diode coupled between the gate and drain, and having:
a lightly doped region having a first conductivity type; and
an annular region and a buried region, each of a second conductivity type, that electrically isolate from the first epitaxial layer the lightly doped region, wherein the first diode provides a conductive path from the drain to the gate when a voltage having a predetermined value occurs at the drain.

12. The circuit of claim 11 wherein the protection circuit further comprises a second diode coupled in series with the first diode between the gate and drain wherein one of the first and second diodes is reversed biased when providing a conductive path.

13. The circuit of claim 12 wherein the protection circuit further comprises a third diode coupled in series with the first and second diodes between the gate and drain wherein the third diode is reverse biased when providing a conductive path.

14. A circuit for protecting a power device from overvoltages, the circuit and power device formed in the same substrate of a first conductivity type, the circuit comprising:
a plurality of diodes coupled in series between a gate and a drain of the power device, said plurality of diodes providing a conductive path from said drain to said gate when a voltage occurs at said drain that exceeds a predetermined amount, wherein said plurality of diodes includes:
a first diode including a heavily doped region of the first conductivity type, formed in a lightly doped region of the first conductivity type; and the circuit further comprises a buried region of a second conductivity type and a heavily doped annular region of the second conductivity type, wherein the buried region and the heavily doped annular region isolate the lightly doped region of the first diode from the substrate.

15. The circuit of claim 14, further comprising a buried region of a second conductivity type and a heavily doped annular region of the second conductivity type, wherein the buried region and the heavily doped annular region isolate the lightly doped region of the first diode from the substrate.

16. The circuit of claim 15, wherein the plurality of diodes includes a second diode that is reversed biased when providing a conductive path.

17. The circuit of claim 16, wherein the second diode includes a heavily doped region of the first conductivity type, formed in a lightly doped region of the first conductivity type.

18. The circuit of claim 13, further comprising a second buried region of a second conductivity type and a second heavily doped annular region of the second conductivity type, wherein the buried region and the heavily doped annular region isolate the lightly doped region of the second diode from the substrate.

19. The circuit of claim 14, wherein the plurality of diodes includes a second diode that is reversed biased when providing a conductive path.

20. The circuit of claim 19, wherein the second diode includes a heavily doped region of the first conductivity type, formed in a lightly doped region of the first conductivity type.

21. The circuit of claim 20, further comprising a second buried region of a second conductivity type and a second heavily doped annular region of the second conductivity type, wherein the buried region and the heavily doped annular region isolate the lightly doped region of the second diode from the substrate.

22. The circuit of claim 11, wherein the first diode further includes a heavily doped annular region and the heavily doped annular region and the region of a second conductivity type isolate the lightly doped region from the first epitaxial layer.

* * * * *